United States Patent
Vanfleteren et al.

(10) Patent No.: US 11,406,020 B2
(45) Date of Patent: Aug. 2, 2022

(54) METHOD OF MANUFACTURING A FLAT DEVICE

(71) Applicants: IMEC VZW, Leuven (BE); Universiteit Gent, Ghent (BE)

(72) Inventors: Jan Vanfleteren, Ghent (BE); Frederick Bossuyt, Ghent (BE); Bart Plovie, Bekegem (BE)

(73) Assignee: IMEC VZW, Ghent (BE)

( * ) Notice: Subject to any disclaimer, the term of this patent is extended or adjusted under 35 U.S.C. 154(b) by 601 days.

(21) Appl. No.: 16/336,004

(22) PCT Filed: Aug. 17, 2017

(86) PCT No.: PCT/EP2017/070883
§ 371 (c)(1),
(2) Date: Mar. 22, 2019

(87) PCT Pub. No.: WO2018/054623
PCT Pub. Date: Mar. 29, 2018

(65) Prior Publication Data
US 2020/0029440 A1  Jan. 23, 2020

(30) Foreign Application Priority Data
Sep. 26, 2016 (EP) .................................. 16190635

(51) Int. Cl.
*H05K 3/00* (2006.01)
*G06F 30/392* (2020.01)
(Continued)

(52) U.S. Cl.
CPC ........... *H05K 3/0005* (2013.01); *B29C 51/46* (2013.01); *G06F 30/392* (2020.01);
(Continued)

(58) Field of Classification Search
CPC ...... H05K 3/0005; H05K 3/284; H05K 3/007; H05K 3/0014; H05K 2201/0129;
(Continued)

(56) References Cited

U.S. PATENT DOCUMENTS 8,552,299 B2 * 10/2013 Rogers .................... H01L 25/50
174/254
9,247,648 B2   1/2016 Vanfleteren et al.
(Continued)

FOREIGN PATENT DOCUMENTS

WO   WO-2006130558 A2 * 12/2006 ........... B81C 99/008
WO   WO-2017174176 A1 * 10/2017 ........... B29C 51/082

OTHER PUBLICATIONS

PCT International Search Report and Written Opinion, PCT International Application No. PCT/EP2017/070883, dated Nov. 17, 2017, 11 pages.
(Continued)

Primary Examiner — Jeffrey T Carley
(74) Attorney, Agent, or Firm — McDonnell Boehnen Hulbert & Berghoff LLP

(57) ABSTRACT

Methods are provided for manufacturing flat devices to be used for forming a shape-retaining non-flat device by deformation of the flat device. Based on the layout of a non-flat device, a layout of a flat device is designed. A method for designing the layout of such a flat device is provided, wherein the method includes inserting mechanical interconnections between pairs of elements to define the position of the elements on a surface of the non-flat device, thus leaving zero or less degrees of freedom for the location of the components. Based on the layout of a flat device thus obtained, the flat device is manufactured and next transformed into the shape-retaining non-flat device by means of a thermoforming process, thereby accurately and reproduc-
(Continued)

ibly positioning the elements at a predetermined location on a surface of the non-flat device.

10 Claims, 6 Drawing Sheets

(51) Int. Cl.
    *B29C 51/46*     (2006.01)
    *H05K 1/02*     (2006.01)
    *H05K 1/18*     (2006.01)
    *H05K 3/28*     (2006.01)
    *H05K 3/32*     (2006.01)
    *B29L 31/34*     (2006.01)

(52) U.S. Cl.
CPC ............ *H05K 1/0283* (2013.01); *H05K 1/189* (2013.01); *H05K 3/007* (2013.01); *H05K 3/0014* (2013.01); *H05K 3/284* (2013.01); *H05K 3/32* (2013.01); *B29L 2031/3425* (2013.01); *H05K 1/0274* (2013.01); *H05K 2201/0129* (2013.01); *H05K 2201/057* (2013.01); *H05K 2201/09263* (2013.01); *H05K 2201/209* (2013.01); *H05K 2201/2072* (2013.01); *H05K 2203/107* (2013.01); *H05K 2203/1316* (2013.01); *H05K 2203/1327* (2013.01)

(58) Field of Classification Search
CPC .... H05K 2201/1316; H05K 2201/1327; B29C 51/46; B29L 2031/3425
See application file for complete search history.

(56) References Cited

U.S. PATENT DOCUMENTS

| | | | | |
|---|---|---|---|---|
| 9,528,667 | B1 * | 12/2016 | Pereyra | F21K 9/90 |
| 9,757,050 | B2 * | 9/2017 | Ghaffari | A61B 5/0538 |
| 9,765,934 | B2 * | 9/2017 | Rogers | H01L 24/24 |
| 2003/0136503 | A1 * | 7/2003 | Green | B32B 37/025 |
| | | | | 156/264 |
| 2010/0238636 | A1 | 9/2010 | Mascaro et al. | |
| 2012/0052268 | A1 * | 3/2012 | Axisa | H01L 23/49838 |
| | | | | 428/212 |
| 2013/0170171 | A1 * | 7/2013 | Wicker | H01L 21/4846 |
| | | | | 361/809 |
| 2013/0333094 | A1 | 12/2013 | Rogers et al. | |
| 2014/0022746 | A1 | 1/2014 | Hsu | |
| 2015/0136837 | A1 * | 5/2015 | Maeda | H05K 13/08 |
| | | | | 228/102 |
| 2016/0157343 | A1 | 6/2016 | Abe et al. | |
| 2017/0356640 | A1 * | 12/2017 | Veenstra | F21V 23/00 |

OTHER PUBLICATIONS

European Search Report, European Patent Application No. 16190635.9, dated Apr. 6, 2017, 7 pages.

Plovie, Bart et al., "2.5D Smart Objects Using Thermoplastic Stretchable Interconnects", IMAPS 2015 Orlando—48th Annual International Symposium on Microelectronics—Oct. 26-29, 2015, pp. 868-873.

* cited by examiner

METHOD OF MANUFACTURING A FLAT DEVICE

CROSS-REFERENCE TO RELATED APPLICATIONS

The present application is a national stage entry of PCT/EP2017/070883, filed Aug. 17, 2017, which claims priority to EP 16190635.9 filed on Sep. 26, 2016, the contents of each of which are hereby incorporated by reference.

BACKGROUND

Methods and technologies are known for fabricating 2.5D (i.e. non-flat) arbitrarily shaped electronics and sensor circuits. For example, using standard printed circuit board ("PCB") technology, semi-rigid electronic circuits having a non-flat shape may be fabricated by interconnecting flat rigid assembled boards using flexible circuitry. Such a combination of flat rigid sub-boards allows approaching a randomly or arbitrarily shaped circuit, but it has limitations in terms of shapes that can be realized.

Another approach that may be used and that allows producing arbitrary free-form shaped rigid devices is based on 3D Molded Interconnect Device ("MID") technology, wherein a 2.5D or 3D molded polymer is used as a substrate, on which electrically conductive traces are applied and on which electronic components are assembled. This technology is rather complex and expensive.

Another, less complex and more cost efficient method is described in "2.5D Smart Objects Using Thermoplastic Stretchable Interconnects" by B. Plovie et al, International Symposium on Microelectronics, Fall 2015, Vol 2015, No 1, pp 868-873. According to this method, an electronic circuit is first fabricated on a 2D (flat) carrier based on a flexible circuit board technology with stretchable (e.g. meander-shaped) electrical connections between the electronic components. Next, the circuit is transferred to a thermoplastic material layer, typically a thermoplastic polymer layer. Afterwards a thermoforming step is performed, comprising heating the structure to a temperature above the glass transition temperature of the thermoplastic material, e.g. thermoplastic polymer, pushing it against a mold having the desired 2.5D shape e.g. using vacuum and cooling down. During the thermoforming step the electrical connections are stretched. This approach is compatible with existing industrial standards for 2D circuit fabrication and it allows cost-effective fabrication of 2.5D free-form rigid smart objects.

When fabricating such 2.5D free-form rigid smart objects, it is desirable that the electronic components are located on the non-flat surface (i.e. after the thermoforming step) at predetermined positions that are reproducible and predictable based on their position on the flat carrier before the thermoforming step). The final position of the electronic components on the non-flat surface may for example be influenced by process parameters used during thermoforming, such as for example material properties, temperature, thermoforming speed and clamping method. FEM (Finite Element Method) modelling could be used to predict the final component positions, but this is not straightforward especially in case of complex structures and/or complex layer stacks.

SUMMARY

It is an object of the present disclosure to provide methods for manufacturing shape-retaining non-flat devices comprising components such as for example electronic components, mechanical components, opto-electronic components, optical components, photonic components and/or sensors, wherein the methods allow accurate and reproducible positioning of the components at predetermined locations on a surface of the non-flat device, for example on a non-flat part of the device surface.

The non-flat devices are manufactured by deformation of a flat device, e.g. by means of a thermoforming process. The non-flat devices thereby obtained are shape-retaining devices, i.e. in the absence of external forces they are retaining their intended shape. The non-flat devices may be rigid, flexible or stretchable devices.

It is a further object of the present disclosure to provide methods for designing and for manufacturing a flat device to be used for forming a shape-retaining non-flat device by deformation of the flat device, wherein the non-flat device comprises components and wherein 30 the methods allow accurate and reproducible positioning of the components at predetermined locations on a surface of the non-flat device.

The above objectives are accomplished by methods according to the present disclosure.

In a first aspect the present disclosure relates to a method for designing the layout of a flat device to be used for forming a shape-retaining non-flat device by deformation of the flat device. A method according to embodiments of the first aspect of the present disclosure comprises: providing a layout of the non-flat device, the non-flat device having a shape with a surface comprising a non-flat surface part, the non-flat device comprising at least one element positioned at a predetermined location on the surface, the non-flat device having a device perimeter delineating a device area of the non-flat device; defining a design area for the layout of the flat device, the design area comprising a flat device area corresponding to the device area of the non-flat device after deformation, the design area optionally further comprising a border area adjacent to the flat device area; if the number of elements included in the layout of the non-flat device is less than three, inserting at least one additional element at a predetermined location within the design area to thereby obtain at least three elements; selecting at least two pairs of elements, each pair of elements consisting of a first element and a second element; calculating for each selected pair of elements a distance between the predetermined location of the first element and the predetermined location of the second element, wherein the distance for each selected pair is calculated as the shortest distance between the first element and the second element over the surface of the non-flat device, and wherein the number of pairs for which a corresponding distance is calculated is selected to unambiguously define the position of the at least one element on the surface, thus leaving zero or less degrees of freedom; inserting the at least three elements at a location within the design area corresponding to their predetermined location after deformation; and inserting within the design area for each selected pair of elements a layout of a mechanical interconnection between the first element and the second element, wherein at least part of the mechanical interconnections is stretchable, wherein the mechanical interconnections have a centerline in a longitudinal direction with a total length at least equal to the corresponding calculated distance between the corresponding first element and second element, thereby obtaining a layout of a flat device.

The at least three elements may comprise component elements, such as for example electronic components, mechanical components, opto-electronic components, optical components, photonic components and/or sensors, the present disclosure not being limited thereto.

The at least three elements may comprise anchoring elements, e.g. providing mechanical reference points. Anchoring elements may for example comprise or consist of a perforation, the present disclosure not being limited thereto. For example, anchoring elements may comprise or consist of rigid elements providing the possibility of accurate positioning and clamping of the device in a thermo-forming tool.

The at least three elements may comprise other elements than component elements or anchoring elements, such as for example decorative or ornamental elements, the present disclosure not being limited thereto.

In embodiments of the present disclosure, the at least one additional element may be an anchoring element, the anchoring element being inserted at a predetermined location within the border area.

In embodiments of the present disclosure, the at least one element may be a component element.

In embodiments of the present disclosure, at least one component element may be positioned at a predetermined location on the non-flat surface part.

In an example of a method in accordance with embodiments of the present disclosure all component elements may be inserted at a predetermined location within the device area. In an example of a method in accordance with embodiments of the present disclosure all anchoring elements may be inserted at a predetermined location within the border area.

In embodiments of the present disclosure mechanical interconnections between two anchoring elements, i.e. between a first anchoring element and a second anchoring element, may be non-stretchable.

In embodiments of the present disclosure the method may further comprise inserting, for at least part of the selected pairs of elements, a layout of an electrical connection between the first element and the second element of the pair.

In embodiments of the present disclosure the layout of the flat device may comprise at least three mechanical interconnections, the at least three mechanical interconnections having a triangular mesh configuration.

In a second aspect the present disclosure relates to a method of manufacturing a flat device to be used for forming a shape-retaining non-flat device by deformation of the flat device. A method according to embodiments of the second aspect of the present disclosure comprises: obtaining a layout of a flat device using a method according to an embodiment of the first aspect; and fabricating the flat device in accordance with the layout of the flat device, wherein fabricating the flat device comprises forming mechanical interconnections. The mechanical interconnections may be formed by providing a patterned layer of a non-stretchable flexible material, the layer being patterned in accordance with the layout of the mechanical interconnections of the layout of the flat device.

In embodiments of the present disclosure, fabricating the flat device may further comprise forming for at least one pair of elements an electrical connection between the first element and the second element of the pair. Forming an electrical connection may comprise providing a patterned layer of an electrically conductive material between the first element and the second element of that pair. In embodiments of the present disclosure, at least part of the electrical connections may be at least partially coincident with a corresponding mechanical connection. The patterned layer of the electrically conductive material may for example be provided on the patterned layer of the non-stretchable flexible material of a corresponding mechanical interconnection between the first element and the second element. The non-stretchable flexible material may thereby support the electrically conductive material and may limit the stretchability of the electrical connection. In some embodiments, the pattern of the layer forming the electrical connections does not extend laterally beyond the pattern of the layer forming the corresponding mechanical connection.

In embodiments of the present disclosure, the method of manufacturing the flat device may further comprise at least partially embedding the flat device in a thermo-formable material. At least partially embedding the flat device in a thermo-formable material may for example comprise forming a stack comprising a first thermo-formable layer, the flat circuit and a second thermo-formable layer, the flat circuit being provided in between the first thermo-formable layer and the second thermo-formable layer.

In embodiments of the present disclosure fabricating the flat device may comprise fabricating the flat device on a temporary flat carrier. At least partially embedding the flat device in a thermo-formable material may comprise removing the flat device from the temporary flat carrier and providing a first thermo-formable layer or layer stack and a second thermo-formable layer or layer stack at least partially embedding the flat device. For example, the first thermo-formable layer or layer stack may be provided at a first side of the flat device before removing the flat device from the temporary flat carrier, the flat device being oriented to or attached to the temporary flat carrier with a second side opposite to the first side. The second thermo-formable layer or layer stack may be provided at the second side of the flat device opposite to the first side, after having removed the flat device with the first thermo-formable layer or layer stack from the temporary flat carrier. However, the present disclosure is not limited thereto and other suitable process step sequences may be used.

In embodiments of the present disclosure fabricating the flat device may comprise fabricating the flat device on a first thermo-formable layer or layer stack. At least partially embedding the flat device in a thermo-formable material may further comprise providing a second thermo-formable layer or layer stack overlaying the flat device.

In a third aspect the present disclosure relates to a method of manufacturing a shape-retaining non-flat device. A method according to embodiments of the third aspect of the present disclosure comprises: obtaining a flat device using a method according to an embodiment of the second aspect; and deforming the flat device into the non-flat device by a thermoforming process using a mold having a shape corresponding to the shape of the non-flat device, thereby stretching the stretchable mechanical interconnections and positioning the at least three elements at their predetermined location.

In embodiments of the present disclosure at least one mechanical interconnection may have a centerline with a total length larger than the corresponding calculated distance. Deforming the flat device into the non-flat device partially stretches the at least one mechanical interconnection, thereby partially straightening its centerline and forming a wavy mechanical interconnection.

In some embodiments, a mechanical interconnection may have a centerline with a total length larger than, e.g. slightly larger than, the corresponding calculated distance such that during deformation of the flat device forces acting on the interconnections may be reduced as compared to forces acting on a mechanical interconnection having a centerline with a total length substantially equal to the corresponding calculated distance. More in particular, such forces may be reduced at locations on a surface of the non-flat device having a large curvature or at locations on a surface of the non-flat device characterized by a change, e.g. a step change, in curvature. Reducing the forces at such locations may substantially reduce or avoid the risk of release of the mechanical interconnections from the surface of the device as a result of the deformation and/or the risk of rupture of the mechanical interconnections. In embodiments of the present disclosure, a change in curvature may for example occur in a non-flat surface part of the non-flat device or it may for example occur at a transition between a non-flat surface part and a flat surface part of the non-flat device. In embodiments of the present disclosure such change in curvature may for example occur at locations corresponding to a borderline between the design area and the border area of the layout of the flat device. In some embodiments of the present disclosure, the part of the flat device corresponding to the border area remains flat and is not deformed during the thermoforming process, the present disclosure not being limited thereto.

In embodiments of the present disclosure at least one mechanical interconnection may have a centerline with a total length substantially equal to the corresponding calculated distance. Deforming the flat device into the non-flat device fully stretches the at least one mechanical interconnection, thereby fully straightening its centerline and forming a straight mechanical interconnection.

In some embodiments, a mechanical interconnection may have a centerline with a total length substantially equal to the corresponding calculated distance such that it may allow more accurate positioning of elements at their predetermined location as compared to a mechanical interconnection having a centerline with a total length larger than the corresponding calculated distance.

In embodiments of the present disclosure the method may further comprise removing a part corresponding to the border area of the flat device, after having deformed the flat device into the non-flat device.

In a fourth aspect the present disclosure relates to a computer program product comprising software code portions configured for executing the method steps according to embodiments of the first aspect when the software code is run on a computer. The present disclosure further relates to a computer readable storage medium comprising such a computer program.

Methods according to embodiments of the present disclosure may allow accurate, predictable and reproducible positioning of components on non-flat shape-retaining surfaces without the need for complex and/or time consuming modeling.

In example methods according to embodiments of the present disclosure, the relative position of elements such as components, e.g. a plurality of components, is constrained by the mechanical interconnections, the mechanical interconnections being provided in a configuration with zero or less than zero degrees of freedom. This leaves only one possible spatial configuration for the elements, e.g. plurality of elements. In some embodiments, this allows fabricating shape-retaining 2.5D (non-flat) devices comprising a plurality of elements positioned on a surface of the device, based on fabricating a flat circuit followed by thermoforming, wherein the position of the elements after the thermoforming step is accurate, predictable and reproducible.

In some example methods according to embodiments of the present disclosure, the accurate positioning of elements on an arbitrarily shaped surface does not require the use of slow, exclusive and/or expensive dedicated assembly machines for 3D component assembly. Further, methods according to embodiments of the present disclosure may allow fast and conventional component assembly on flat substrates, using cheap standard industrial equipment.

Particular aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure.

The reference figures quoted below refer to the attached drawings.

BRIEF DESCRIPTION OF THE DRAWINGS

FIG. 4(a) shows a top view and FIG. 4(b) shows a side view.

FIG. 7(a) shows a fully stretched, straight mechanical interconnection. FIG. 7(b) shows a partially stretched, slightly wavy mechanical interconnection.

Figure 1:
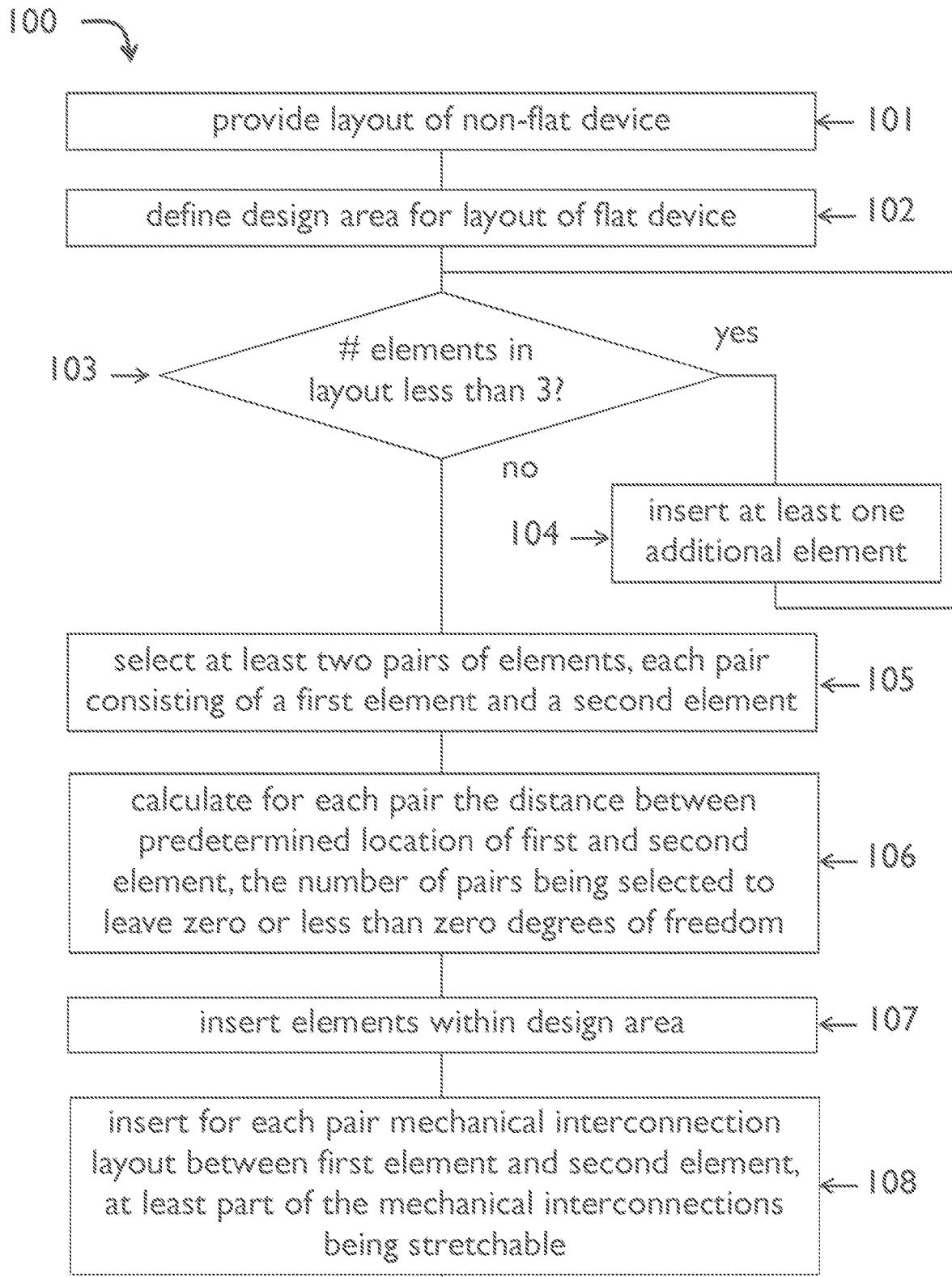
FIG. 1 schematically illustrates an example of a method for designing the layout of a flat device to be used for forming a shape-retaining non-flat device by deformation of the flat device, according to an embodiment of the present disclosure.

In the different figures, the same reference signs refer to the same or analogous elements.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment.

Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

In the context of the present disclosure, a 2.5D structure or 2.5D shaped device is a structure or device that is non-flat. Such a structure or device has at least one non-flat surface such as a curved surface. In the context of the present disclosure, '2.5D structure' or '2.5D device' and 'non-flat structure' or 'non-flat device' are interchangeably used to refer to such structures or devices. 2.5D structures are different from 2D (flat, planar) structures and they are different from 3D structures (volumes). A 2.5D structure may for example be seen as corresponding to a shell or a surface layer of a 3D structure. Typically the thickness of such shell or surface layer is substantially smaller (e.g. in the range between less than 1 mm and 5 mm) than its lateral dimensions (which may for example be in the range of 1 centimeter to tens of centimeters), the present disclosure not being limited thereto.

In the context of the present disclosure, flexible means non-stiff, non-rigid, i.e. able to bend without breaking or being damaged, but not stretchable. A flexible structure is adapted to be deformable in a certain direction during normal use of the structure, without being damaged, but does not elongate.

In the context of the present disclosure, stretchable means elastic, i.e. elastically deformable with elongation, or visco-elastic. A stretchable structure is adapted to be elastically deformable (with elongation) during normal use, under an applied force. It may return substantially to its original shape, substantially without permanent deformation, when the applied force is relaxed. In the context of the present disclosure, stretchable may also mean plastically deformable. Such a plastically deformable structure is adapted to be deformable during normal use, under an applied force, but it may not return substantially to its original shape when the applied force is relaxed. A stretchable structure can be made out of non-stretchable materials, such as flexible materials or even rigid materials. An example is a metallic spring. The metal in itself is a rigid bulk material but the shaping of the material leads to a certain degree of flexibility and even a certain degree of stretchability.

In the context of the present disclosure, rigid means stiff, i.e. not able to bend or highly resistant to bending.

In the context of the present disclosure, a shape-retaining device means a device that retains or keeps its intended shape in the absence of external forces. More in particular, in the context of the present disclosure a shape-retaining non-flat device refers to a thermo-formed non flat device that, in the absence of external forces, retains the shape of the mold used for thermoforming after the device has been removed from the thermoforming tool. Such a device may be a rigid device, a flexible device or a stretchable device.

In the context of the present disclosure, a thermoplastic material is a material that becomes pliable or moldable above a specific temperature (the glass transition temperature of the material) and solidifies upon cooling. Above its glass transition temperature and below its melting point the physical properties of a thermoplastic material change without an associated phase change.

In the context of the present disclosure, a thermoset or a thermosetting material is a pre-polymer in a soft solid or viscous state that changes irreversibly into an infusible, insoluble polymer network by curing, e.g. by heating. Examples of thermosetting materials are epoxies and some poly-urethanes.

In the context of the present disclosure, a thermo-formable material is a material that may be formed into a predetermined solid shape, e.g. a non-flat solid shape, by means of a thermoforming process comprising heating, shaping and cooling. Examples of thermo-formable materials are thermoplastic materials, such as thermoplastic polymers, some uncured or partially cured (prepreg) thermosetting materials such as epoxies, and composite materials comprising a thermoplastic or a thermosetting material. Some non-limiting examples of thermo-formable composite materials are mats or fabrics impregnated with a thermoplastic or thermosetting material, such as for example a carbon fiber mat impregnated with an epoxy; a thermoplastic or thermosetting material with embedded (nano-sized) elements, such as for example a polyurethane with embedded metal (e.g. Ag) nanowires; or a coated thermoplastic or thermosetting material, such as for example a polystyrene with a metal coating.

The disclosure will now be described by a detailed description of several embodiments of the disclosure. It is clear that other embodiments of the disclosure can be configured according to the knowledge of persons skilled in the art without departing from the true spirit or technical teaching of the disclosure, the disclosure being limited only by the terms of the appended claims.

The present disclosure provides methods for manufacturing shape-retaining non-flat devices having a non-flat, e.g. curved, surface part, the devices comprising at least one, for example a plurality of mechanically interconnected elements, e.g. components, positioned at predetermined spaced locations on the device surface, such as for example on a non-flat surface part of the device surface. The elements may for example be components. In addition to being mechanically interconnected, they may also be electrically connected or optically connected. The non-flat devices are manufactured by deformation of a flat device, e.g. by means of a thermoforming process. The present disclosure further provides methods for designing and for manufacturing a flat device to be used for forming a shape-retaining non-flat device by deformation of the flat device.

An example of a method 100 for designing the layout of a flat device to be used for forming a shape-retaining non-flat device by deformation of the flat device according to an embodiment of a first aspect of the present disclosure is schematically illustrated in FIG. 1. The method 100 comprises: providing 101 a layout of the non-flat device, the non-flat device comprising at least one element at a predetermined location on its surface and having a device perimeter delineating a device area of the non-flat device; defining 102 a design area for the layout of the flat device, the design area comprising a flat device area corresponding to the device area of the non-flat device after deformation and optionally comprising a border area adjacent to the flat device area; checking 103 if the number of elements in the layout is less than three; in case the number of elements is less than three: inserting 104 at least one additional element at a predetermined location within the design area to thereby obtain at least three elements; selecting 105 at least two pairs of elements, each pair consisting of a first element and a second element; calculating 106 for each pair of elements a distance between the predetermined location of the first element and the predetermined location of the second element, wherein the number of pairs is selected to leave zero or less than zero degrees of freedom; inserting 107 the elements within the design area; and inserting 108 for each selected pair a layout of a mechanical interconnection between the first element and the second element, at least part of the mechanical interconnections being stretchable. This method 100 results in a layout of a flat device.

Figure 4A:
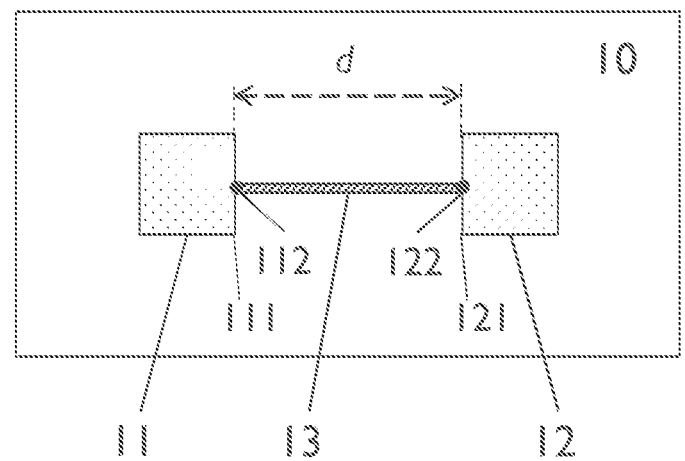
FIG. 4(a)-4(b) schematically illustrate a part of a non-flat surface with a first element and a second element located thereon.
Figure 4B:
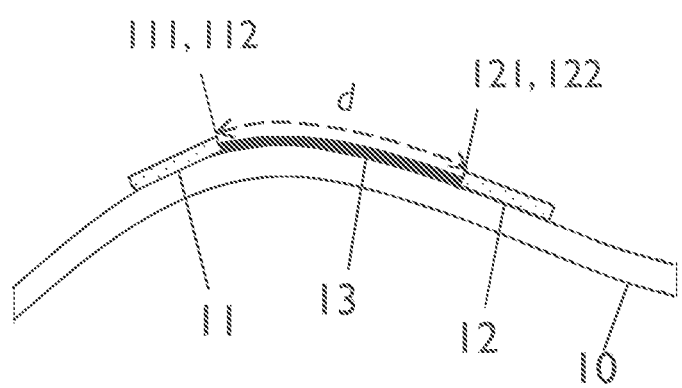

In a method according to embodiments of the present disclosure, calculating the distance between a first element and a second element of a pair refers to calculating the shortest distance between the first element and the second element over the non-flat surface. In embodiments of the present disclosure, the distance d (schematically illustrated in FIG. 4(a)) between the predetermined locations of a pair of elements, i.e. between the predetermined location of a first element 11 and the predetermined location of a second element 12 of a pair of elements, may be calculated as a distance between a first edge 111 of the first element 11 and a second edge 121 of the second element 12 closest to the first edge 111 of the first element 11, more in particular between a first point 112 of the first edge 111 where the mechanical interconnection 13 is in contact with 5 (connected to) the first element 11 and a second point 122 of the second edge 121 where the mechanical interconnection 13 is in contact with (connected to) the second element 12. This is schematically illustrated in FIGS. 4(a)-(b), wherein FIG. 4(a) shows a top view of a structure comprising a first element 11, a second element 12 and a mechanical interconnection 13 between the first element 11 and the second element 12. FIG. 4(b) shows a side view (cross section) of the 10 same structure and shows part of a non-flat (curved) device surface 10 on which the first element 11 and the second element 12 are located. Although in the drawings only a single mechanical interconnection 13 is shown, the present disclosure is not limited thereto. In embodiments of the present disclosure more than one mechanical interconnection 13 may be provided between a first element 11 and a second element 12 of a pair of elements.

The number of pairs for which a corresponding distance is calculated is selected to leave zero or less than zero degrees of freedom for the final position of the elements on the surface of the non-flat device. In other words, the number of pairs for which the corresponding distance is calculated is selected to unambiguously define the relative positions of the elements on the non-flat surface.

In a method according to embodiments of the present disclosure, the layout of the mechanical interconnections may for example comprise a pattern of line-shaped features (i.e. features having a small width as compared to their length), wherein the line-shaped elements may have straight edges or non-straight edges, such as for example curved or meandering edges. A layout of a mechanical interconnection may comprise a combination of line-shaped elements, e.g. a combination of elements with straight and/or non-straight edges. In embodiments of the present disclosure, the layout of the mechanical interconnections is such that the mechanical interconnections have a centerline in a longitudinal direction with a total length that is at least equal to the corresponding calculated distance between the corresponding first element and second element. In embodiments wherein a plurality of elements are electrically connected, at least part of the electrical connections may be stretchable. In embodiments wherein a plurality of elements are optically connected, at least part of the optical connections may be stretchable.

In embodiments of a method (100) according to the present disclosure, the elements may for example be component elements or anchoring elements. Component elements may for example comprise electronic component elements, opto-electronic component elements, optical component elements, photonic component elements, mechanical component elements and/or sensor elements, the present disclosure not being limited thereto. In the context of the present description, a component element may also refer to an element including a component and a supporting component island, as further described. Anchoring elements may for example comprise or consist of a perforation or of a rigid element providing the possibility of accurate positioning and clamping in a thermoforming tool.

In embodiments of a method (100) according to the present disclosure, inserting (104) at least one additional element may comprise inserting an anchoring element. In some embodiments, more than one anchoring element, e.g. a plurality of anchoring elements is inserted in the layout of the flat device. In an example embodiment where the number of elements included in the layout of the non-flat device is not less than three, at least one anchoring element may be inserted in the layout of the flat device. The plurality of anchoring elements may be inserted in the border area of the design area of the flat device. Such anchoring elements may be provided to allow an accurate positioning of the flat device relative to the mold that is used during deformation, e.g. by means of thermoforming, of the flat device into the non-flat device. In some embodiments, the anchoring elements are inserted in the border area of the layout, in such a way that they are distributed along edges of the flat device. Further, in some embodiments, mechanical interconnections are inserted between each anchoring element and at least one component element. The number of pairs of anchoring elements and corresponding component elements for which a mechanical interconnection is inserted in the layout of the flat device is selected to unambiguously define the relative position of the components with respect to the anchoring elements. An anchoring element may for example comprise a perforation that fits over a pin of a thermoforming tool or it may for example comprise a rigid element. These anchoring elements are clamped in a fixed position in the thermoforming tool and provide mechanical reference points. In embodiments of the present disclosure, all component elements have a unique position with respect to these reference points after thermoforming.

Figure 2:
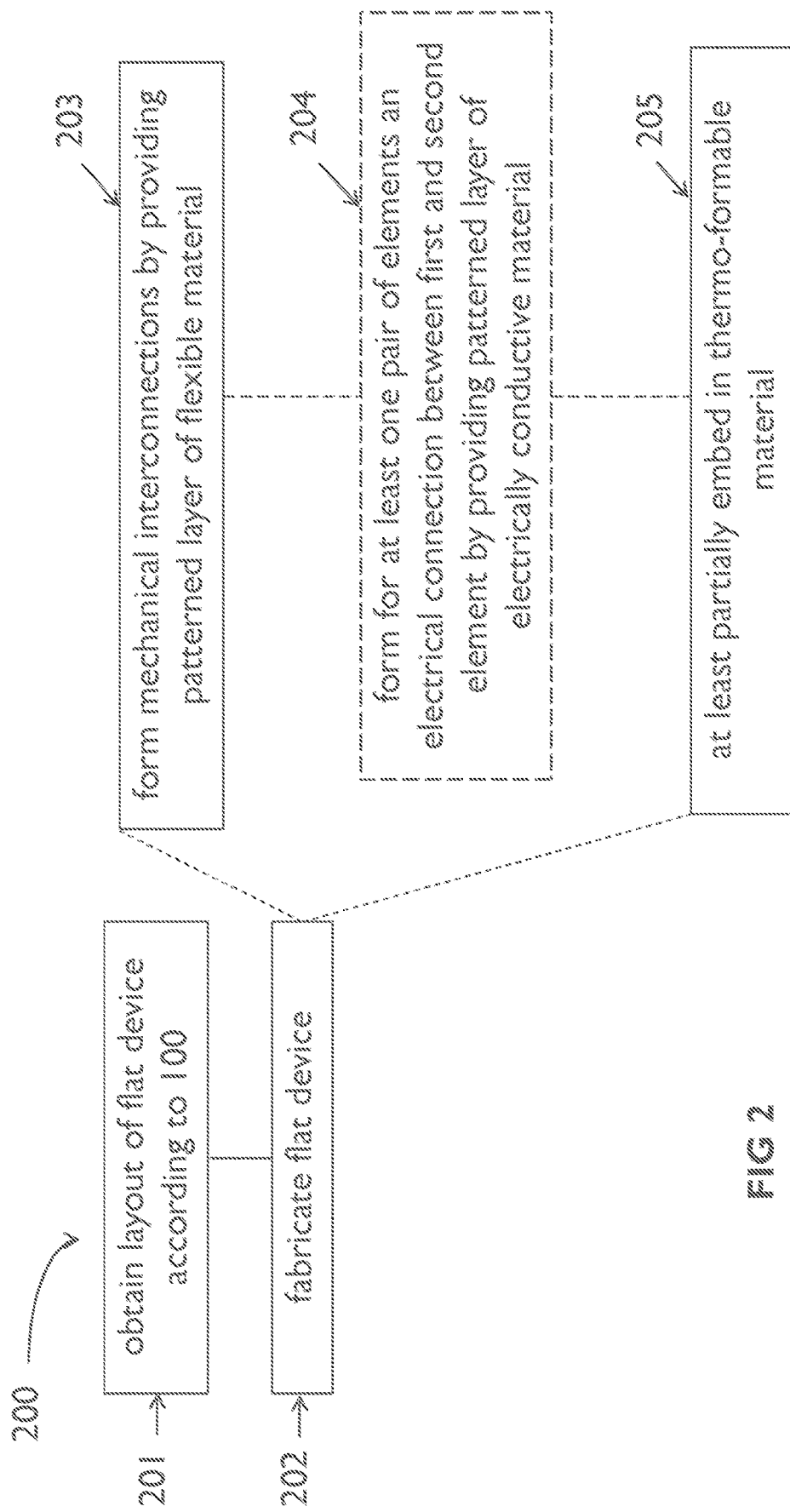
FIG. 2 schematically illustrates an example of a method of manufacturing a flat device to be used for forming a shape-retaining non-flat device by deformation of the flat device, according an embodiment of the present disclosure.

An example of a method 200 of manufacturing a flat device to be used for forming a shape-retaining non-flat device by deformation of the flat device according to an embodiment of the second aspect of the present disclosure is schematically illustrated in FIG. 2. The method comprises: obtaining (201) a layout of a flat device according to an embodiment of the first aspect of the present disclosure; and fabricating (202) the flat device in accordance with the layout of the flat device, wherein fabricating (202) the flat device comprises forming mechanical interconnections by providing a patterned layer of a non-stretchable flexible material, such as for example a polyimide, a polyester such as polyethylene naphthalate (PEN) or polyethylene terephthalate (PET), or an epoxy, the present disclosure not being limited thereto. The patterned layer of the non-stretchable flexible material is patterned in accordance with the layout of the mechanical interconnections in the layout of the flat device. For example, the layer of non-stretchable flexible material may have a pattern of line-shaped features as described above.

Fabricating (202) the flat device further comprises including the elements, more in particular providing the component elements and forming the anchoring elements, and interconnecting pairs of elements by the corresponding mechanical interconnections.

In embodiments of the present disclosure, the components may for example comprise electronic components, opto-electronic components, optical components, photonic components, mechanical components and/or sensors, the present disclosure not being limited thereto.

In addition to being mechanically interconnected, at least part of the elements, e.g. components, may optionally also be electrically connected or optically connected. In such embodiments, fabricating (202) the flat device further comprises forming (204) for at least one pair of elements an electrical (respectively optical) connection between the first element and the second element of the pair. Forming (204) an electrical connection may for example comprise providing a patterned layer of an electrically conductive material between the first element and the second element of the pair. Such electrical connections may be stretchable. The patterned layer of the electrically conductive material may for example comprise or consist of line-shaped elements, the line-shaped elements having straight or non-straight edges, such as for example curved or meandering edges. The patterned layer of electrically conductive material may comprise a combination of line-shaped elements, e.g. a combination of elements with straight and/or non-straight edges. The electrically conductive material may for example comprise a metal such as Cu or Ag, the present disclosure not being limited thereto. Forming an optical connection may for example comprise providing an optical fiber, e.g. a glass or polymer optical fiber or providing an optical waveguide, e.g. a polymer optical waveguide.

In embodiments of the present disclosure the patterned layer of electrically conductive material may for example be provided on the patterned layer of the non-stretchable flexible material of the corresponding mechanical interconnection between the first element and the second element of the pair of elements. In embodiments at least part of the electrical connections may be substantially coincident with the mechanical interconnections. The flexible layer, e.g. polyimide layer, forming the mechanical interconnection may provide support to the electrically conductive layer, e.g. metal layer, forming the electrical connection. The dimensions, e.g. the width, of the patterned metal layer may deviate from the dimensions, e.g. width, of the patterned flexible layer, to provide a stretch stop function as for example disclosed in U.S. Pat. No. 9,247,648. In other embodiments the electrical connections may be provided separately from the mechanical interconnections, or a combination of both approaches (substantially coincident and separate connections) may be used.

In embodiments of the present disclosure, the elements 11, 12, e.g. components, may be located on component islands (as for example disclosed in U.S. Pat. No. 9,247,648) and the mechanical interconnections 13 may be in contact with/connected to/attached to the component islands. In such embodiments the distance between the predetermined locations of a pair of elements, i.e. the distance between the predetermined location of a first component located on a first component island and a second component located on a second component island, may be calculated as a distance between a first edge of the first component island and a second edge of the second component island closest to the first edge of the first component island, more in particular between a first point of the first edge where the mechanical interconnection is in contact with the first component island and a second point of the second edge where the mechanical interconnection is in contact with the second component island.

In embodiments of the present disclosure the mechanical interconnections may be made of a non-stretchable material, such as for example a non-stretchable flexible material, e.g. a polyimide material. In embodiments of the present disclosure wherein components are located on component islands, the component islands may be made of the same material as the mechanical interconnections or of another rigid support material or of a combination of both.

In embodiments of the present disclosure, fabricating (202) the flat device may further comprise at least partially embedding (205) the flat device in a thermo-formable material, such as a thermoplastic material, a thermosetting material or a composite material.

Different approaches may be used for fabricating (202) the flat device according to embodiments of the present disclosure.

For example, the flat device may be fabricated on a temporary flat carrier, e.g. on a temporary rigid carrier. Embedding the flat device in a thermo-formable material may then comprise removing the flat device from the temporary flat carrier and providing a first thermo formable layer or layer stack and a second thermo-formable layer or layer stack embedding the flat device. For example, the flat device may be covered by a first thermo-formable layer or layer stack while it is still present on the temporary carrier, at a first side of the flat device (the side opposite to the side where it is attached to the carrier); next the temporary carrier may be removed and finally a second thermo-formable layer or layer stack may be provided at a second side of the flat device opposite to the first side, i.e. at the side where the temporary carrier has been removed in such a way that the flat device is fully or substantially embedded in or fully or substantially enclosed by thermo-formable material. For example, in other embodiments the flat device may first be removed from the temporary carrier and afterwards it may be embedded between a first thermo-formable layer or layer stack and a second thermo-formable layer or layer stack. The first thermo-formable layer and/or the second thermo-formable layer may be patterned, e.g. openings or holes may be provided through the first thermo-formable layer and/or the second thermo-formable layer, e.g. to allow access to connectors, e.g. electrical or optical connectors of the device. The first thermo-formable layer and/or the second thermo-formable layer may consist of a single layer or may comprise a plurality of layers, e.g. a layer stack comprising at least two layers comprising a same or a different material.

In other embodiments the flat device may be fabricated on a first thermo-formable layer or layer stack and embedding the flat device in a thermo-formable material may further comprise providing a second thermo-formable layer or layer stack overlaying the flat device in such a way that the flat device is fully or substantially embedded in or fully or substantially enclosed by thermo-formable material. The first thermo-formable layer and/or the second thermo-formable layer may be patterned, e.g. openings or holes may be provided through the first thermo-formable layer and/or the second thermo-formable layer, e.g. to allow access to connectors, e.g. electrical or optical connectors of the flat device. The first thermo-formable layer and/or the second thermo-formable layer may consist of a single layer or may comprise a plurality of layers, e.g. a layer stack comprising at least two layers comprising a same or a different material.

In embodiments wherein the flat device is fabricated on a temporary carrier, its manufacturing process may for example be started from a flexible circuit board, e.g. using polyimide flexible copper clad laminate. The laminate may be attached to a temporary reusable carrier board, (e.g., a rigid board, such as FIGS. 4(a) and 4(b)). The flexible circuit board may for example be attached to the temporary carrier board by means of a silicone based high-temperature pressure sensitive adhesive, e.g. using a hot roll laminator at 120° C. at low speed (to avoid formation of air bubbles). The copper may be patterned, for example by lithography and etching, e.g. for forming electrical connections and/or contact pads. In some embodiments the copper patterning is done before attachment of the flexible circuit board to the temporary carrier board. Through selective laser structuring of the polyimide layer of the polyimide flexible copper clad laminate the pattern of the mechanical interconnections (such as e.g. meander shaped mechanical interconnections) and the pattern of component islands are defined, in accordance with the patterns in the layout of the flat device. Such selective layer structuring of the polyimide layer may be done without causing damage to the carrier board or pressure sensitive adhesive. For example, a pulsed UV Nd:YAG laser with picosecond pulse length can be used. After removing the residual material (i.e. the residues of the polyimide layer in between the mechanical interconnections and component islands) components may be assembled e.g. using a high-temperature lead-free solder process. A solder mask may be locally applied by screen printing, the components are then placed and the boards are sent through a reflow oven e.g. for infrared reflow soldering or e.g. using a vapor phase oven.

The flat device may then be transferred to a thermo-formable material layer, such as for example a layer of thermo-formable polyurethane (TPU), ethylene vinyl-acetate (EVA), PET, PET-G (glycol-5 modified PET), polystyrene or polycarbonate, the present disclosure not being limited thereto. This transfer may for example be done by means of a lamination process. For example, a thermo-formable film or layer may be laminated with (on top of) the flat device in a vacuum press. To conform to the surface of the device and to avoid damage to the components that are part of the flat device, the press book may be modified to include a foam press pad, such as e.g. a polydimethylsiloxane (PDMS) rubber foam press pad. The required thickness of such a foam press pad depends on the profile/thickness of the components, the thickness and the properties of the thermo-formable layer, the thickness of the carrier board, and the forces applied during the thermoforming process. In some embodiments, the thickness of the thermo-formable material is larger than the thickness of the thickest component to be embedded. For example, when using electronic components having a thickness up to 300 micrometer, the thickness of the foam press pad may be in the range between 0.2 mm and 20 mm, such as for example 500 micrometer, the present disclosure not being limited thereto. The carrier board may be a rigid board, such as for example an FR4 board having a thickness in the range between 2 mm and 3 mm, the present disclosure not being limited thereto. The thermo-formable material layer with the attached flat device is then removed, such as for example by peeling, from the pressure sensitive silicone adhesive. This is enabled by the weaker adhesion between the pressure sensitive silicone adhesive and the flexible circuit board and thermo-formable material layer as compared to the adhesion between the thermo-formable material layer and the flexible circuit board.

Further layers, e.g. further layers of thermo-formable material may be laminated to the thermo-formable layer embedding the device. Such further layers may for example be laminated to the device for providing protection, e.g. protection against mechanical damage such as scratches. For example, the flat device may be laminated between two layers of a thermo-formable material as described above. This thermo-formable material may then for example be covered on both sides using a rigid thermo-formable material such as for example a 2 mm thick polycarbonate— acrylonitrile butadiene styrene blend (PC/ABS), e.g. providing mechanical protection. Such further layers may for example be laminated to the device for other purposes than protection, such as for example for decorative purposes of for providing an additional functionality, e.g. electrical or optical functionality, the present disclosure not being limited thereto.

The further layers of thermo-formable material may be applied after release of the structure from the pressure sensitive silicone adhesive or before the release. For example, they may be included during the lamination process step wherein the circuit is transferred to the thermo-formable material film. Afterwards the sheet may be dried, for example in a convection furnace, to remove moisture. The temperature at which the sheet is dried depends on the material used, and may for example be in the range between 70° C. and 100° C., the present disclosure not being limited thereto.

The manufacturing process described hereinabove is only one example, and the present disclosure is not limited thereto.

Figure 3:
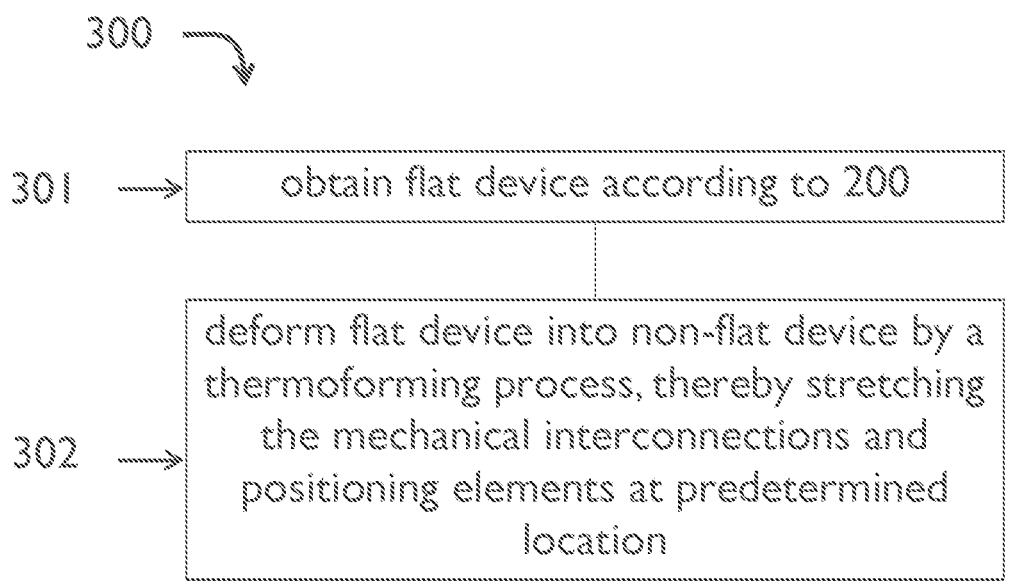
FIG. 3 schematically illustrates an example of a method of manufacturing a shape-retaining non-flat device, according to an embodiment of the present disclosure.

An example of a method 300 for manufacturing a shape-retaining non-flat device according to an embodiment of a third aspect of the present disclosure is schematically illustrated in FIG. 3. The method 300 comprises: obtaining a flat device according to an embodiment of a method 200 of the second aspect; and deforming the flat device into the non-flat device by a thermoforming process using a mold having a shape corresponding to the shape of the non-flat device. As a result of the thermoforming process the stretchable mechanical interconnections of the flat device are stretched such that the elements are positioned at their predetermined location. The stretchable mechanical interconnections may be stretched till they reach a non-extendable state.

In embodiments of the present disclosure, the thermoforming process may for example comprise vacuum forming and/or high pressure forming.

Vacuum forming comprises first performing a heating step, thereby heating the structure comprising the flat device to a predetermined temperature. In embodiments wherein the thermo-formable material comprises a thermoplastic material, the heating step comprises heating to a temperature that is higher than a glass transition temperature and lower than a melting temperature of the material. In embodiments wherein the thermo-formable material comprises a thermosetting material, the heating step comprises heating to a temperature that is higher than a curing temperature of the thermosetting material. Next the structure is pulled against a forming tool by means of a strong vacuum (e.g. −0.2 bar to −1 bar, the present disclosure not being limited thereto). The forming tool comprises a mold having a shape corresponding to the shape of the non-flat device to be fabricated. The mold may for example be made of a metal, such as aluminum. Contact with such a mold cools down the heated structure, such that its temperature is reduced below the glass transition temperature of the thermo-formable material in case of a thermoplastic material and below the curing temperature of the thermo-formable material in case of a thermosetting material. The shaped device is then removed from the forming tool.

High pressure forming comprises first performing a heating step, thereby heating the structure comprising the flat device to a predetermined temperature. In embodiments wherein the thermo-formable material comprises a thermoplastic material, the heating step comprises heating to a temperature that is higher than a glass transition temperature and lower than a melting temperature of the material. In embodiments wherein the thermo-formable material comprises a thermosetting material, the heating step comprises heating to a temperature that is higher than a curing temperature of the thermosetting material. Next the structure is pushed against a forming tool by means of a high pressure (e.g. in the range between 2 bar and 300 bar, such as for example in the range between 50 bar and 150 bar, the present disclosure not being limited thereto), e.g. air pressure. The forming tool comprises a mold having a shape corresponding to the shape of the non-flat device to be fabricated. The mold may for example be made of a metal, such as aluminum. Contact with such a mold cools down the heated structure, such that its temperature is reduced below the glass transition temperature of the thermo-formable material in case of a thermoplastic material and below the curing temperature of the thermo-formable material in case of a thermosetting material.

After cooling down, the shaped device is removed from the forming tool. The thermoformable material and thus the device embedded in the thermo-formable material retains the shape of the forming tool. Vacuum forming and high pressure forming may be combined into a single thermoforming tool and both may be simultaneously used in a single forming cycle of the thermoforming process.

Figure 5:
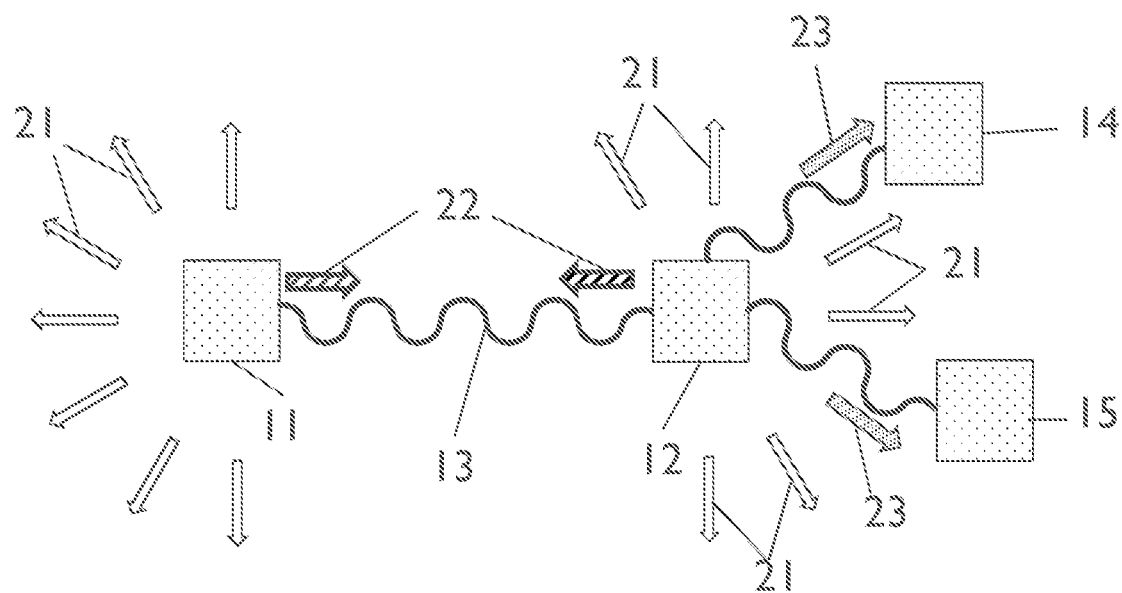
FIG. 5 schematically illustrates different forces acting upon a first element and a second element of a pair of mechanically interconnected elements, as may occur during a thermoforming process in an example of a method according to an embodiment of the present disclosure.

As schematically illustrated in FIG. 5, during the thermoforming process, different forces act upon the elements, e.g. anchoring elements, component elements and/or component islands, of each pair of mechanically interconnected elements. A first force or first forces 21 result from the flowing of the thermo-formable material during the thermoforming process. These forces act in a direction corresponding to the direction of the thermo-formable material flow, i.e. mainly in directions corresponding to an increase in distance between mechanically interconnected elements, i.e. in directions corresponding to an increasing distance d between a first element 11 and a second element 12 for each of the pairs of mechanically interconnected elements. A second force or second forces 22 result from the presence of the mechanical interconnection 13 between a first element 11 and a second element 12 for the pairs of mechanically interconnected components. These forces act in a direction corresponding to a decrease in distance between the two mechanically interconnected elements of the pairs, i.e. in a direction corresponding to a decreasing distance d between a first element 11 and a second element 12 for each of the pairs of mechanically interconnected elements. A third force or third forces 23 result from the presence of mechanical interconnections between an element 11, 12 of a given pair of mechanically interconnected elements and a further, e.g. third or fourth, element to which either the first element 11 or the second element 12 of that pair of mechanically interconnected elements is mechanically interconnected. These forces mainly act in a direction corresponding to an increase in distance between the elements of that given pair of mechanically interconnected elements, i.e. in a direction corresponding to an increasing distance d between the first element 11 and the second element 12 for that pair of mechanically interconnected elements.

Figure 6:
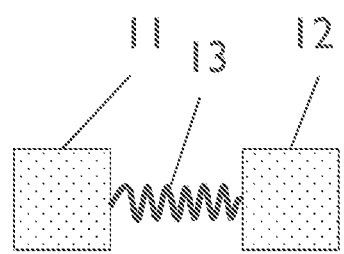
FIG. 6 schematically shows a first element and a second element interconnected by a stretchable mechanical interconnection, as an illustration of how such elements and interconnections may be configured on a layout of a flat device in an example of a method according to an embodiment of the present disclosure.

At the beginning of the thermoforming process the stretchable mechanical interconnections 13 may be strongly curved, e.g. strongly meandering, as for example schematically illustrated in FIG. 6, and the second forces 22 and third forces 23 are small as compared to the first forces 21. At this initial stage of the thermoforming process the element movement is to a large extent determined by the thermo-formable material flow. As the thermoforming process proceeds, the device evolves from flat to non-flat, the device surface is extended and the mechanical interconnections 13 elongate. As a consequence the second and third forces originating from the mechanical interconnections increase.

In embodiments of the present disclosure mechanical interconnections may be designed in such a way that from a certain point in the thermoforming process on, the second and third forces are larger than the first forces and the movement (and the position) of each element is mainly determined, not by the polymer flow, but by the resulting force of all mechanical interconnections connected to that element.

At the end of the thermoforming process a condition is reached wherein the resulting force vector acting on a element and resulting from the combination of second and third forces (i.e. a combination of the forces originating from all mechanical interconnections connected to that element) is substantially zero. In this equilibrium condition the position of each of the elements is fixed to their respective predetermined location. As towards the end of the thermoforming process the second and third forces are substantially larger than first forces (resulting from the thermo-formable material flow), changes in the polymer flow related forces do not substantially influence this equilibrium.

Figure 7A:
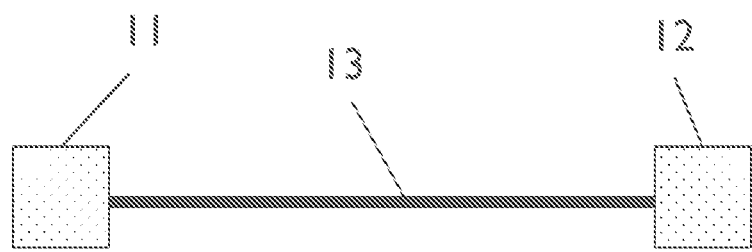
FIG. 7(a)-7(b) schematically show a first element and a second element interconnected by a mechanical interconnection in a non-extendable state, as an illustration of how such elements and interconnections may be configured on a non-flat surface after having performed the thermoforming process in an example of a method according to an embodiment of the third aspect of the present disclosure.
Figure 7B:
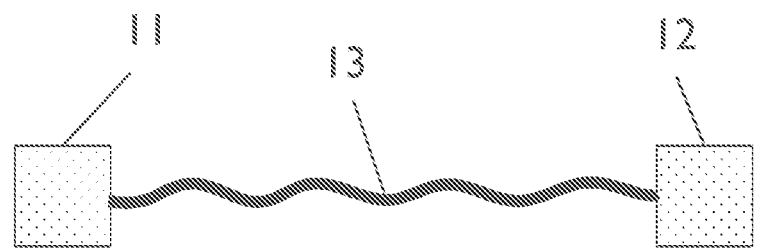

In embodiments of the present disclosure the mechanical interconnections may be deformed (extended) from a strongly meandering initial shape (as schematically illustrated in FIG. 6) to a substantially straight final shape, as schematically illustrated in FIG. 7(a). In other embodiments of the present disclosure the mechanical interconnections may be deformed (extended) from a strongly meandering initial shape to a slightly meandering shape in a non-extendable state, as schematically illustrated in FIG. 7(b).

In the context of the present disclosure, 'extendable mechanical interconnection' means that the forces, acting during the thermoforming process on a first element and a second element that are mechanically interconnected by that mechanical interconnection are sufficiently large to deform the shape (e.g. meandering shape) of the mechanical interconnection, resulting in an increase of the distance between the first element and the second element and an extension or elongation of the mechanical interconnection therein between. The 'non-extendable' state of mechanical interconnection between a first element and a second element (non-extendable mechanical interconnection), reached at the end of the thermoforming process, means that the combination of the first forces (originating from the thermoforming process, more in particular from the thermo-formable material flow) and the third forces (originating from mechanical interconnections to further elements) acting on the first element and on the second element, is insufficient to overcome the second forces originating from the mechanical interconnection between the first element and the second element. In this non-extendable state the distance d between the element and the second element does not further increase.

In a method according to embodiments of the present disclosure, at the end of the thermoforming process all mechanical interconnections may be in a non-extendable state and thus an accurate position of the plurality of elements is obtained. In some embodiments the non-extendable state may be a state wherein all mechanical interconnections are substantially or fully straightened, i.e. at the end of the thermoforming process all mechanical interconnections may be substantially or fully straight. In other embodiments the non-extendable state may be a state wherein all mechanical interconnections are only partially straightened, i.e. at the end of the thermoforming process the mechanical interconnections may be slightly wavy, e.g. slightly curved, e.g. slightly meandering. In other embodiments, at the end of the thermoforming process, part of the mechanical interconnections may be substantially or fully straight and another part of the mechanical interconnection may be slightly wavy.

In some embodiments of the present disclosure, the non-extendable state of at least part of the mechanical interconnections may correspond to a slightly wavy (e.g. slightly meandering) shape of the mechanical interconnections at the end of the thermoforming process that the risk of breaking of the mechanical interconnections and/or the risk of emerging release of the mechanical interconnections from the embedding material (e.g. at locations with large curvature) may be avoided or substantially reduced.

In embodiments according to the present disclosure, the configuration of the mechanical interconnections may for example be a configuration wherein a triangular mesh of mechanical interconnections between the plurality of elements is provided. Such a triangular mesh configuration allows obtaining a unique spatial positioning of the plurality of elements (i.e. a number of degrees of freedom equal to zero or negative). However, the present disclosure is not limited thereto and other solutions resulting in a configuration having zero degrees of freedom (or less than zero degrees of freedom) are possible.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

It is to be understood that although certain embodiments, specific constructions and configurations, as well as materials, have been discussed herein, various changes or modifications in form and detail may be made without departing from the scope of this disclosure. Whereas the above detailed description as well as the summary of the disclosure has been focused on a method for fabricating a device, the present disclosure also relates to devices obtained using a method according to any of the embodiments as described above.

The invention claimed is:

1. A method of manufacturing a flat device to be used for forming a shape-retaining non-flat device by deformation of the flat device, the method comprising:
 (i) obtaining a layout of the flat device, comprising:
   providing a layout of the non-flat device, the non-flat device having a shape with a surface comprising a non-flat surface part, the non-flat device comprising at least one element positioned at a predetermined location on the surface, the non-flat device comprising a device perimeter delineating a device area of the non-flat device;

defining a design area for the layout of the flat device, the design area comprising a flat device area corresponding to the device area of the non-flat device after deformation, the design area further comprising a border area adjacent to the flat device area;

if the layout of the non-flat device comprises less than three elements, inserting at least one additional element at a predetermined location within the design area to obtain at least three elements, each of the at least three elements having a corresponding predetermined location on the surface of the non-flat device;

selecting at least two pairs of elements, each pair of elements consisting of a first element of the at least three elements and a second element of the at least three elements;

calculating for each selected pair of elements a distance between the predetermined location corresponding to the first element and the predetermined location corresponding to the second element, the distance being the distance over the surface of the non-flat device after deformation of the flat device,
wherein the distance for each selected pair is calculated as the shortest distance between the first element and the second element over the surface of the non-flat device, inserting the at least one element within the design area of the layout of the flat device, at a location corresponding to the at least one element predetermined locations after deformation; and inserting within the design area for each selected pair of elements a layout of a mechanical interconnection between the first element and the second element,
wherein at least part of each of the mechanical interconnections is stretchable, and
wherein each of the mechanical interconnections has a centerline in a longitudinal direction with a total length at least equal to the corresponding calculated distance between the corresponding first element and second element on the surface of the non-flat device after deformation,
wherein the number of pairs for which the distance is calculated and for which a layout of a mechanical interconnection is inserted within the design area is selected to define the relative position of the at least three elements on the non-flat surface after deformation of the flat device into the shape-retaining non-flat device, thus leaving zero or less degrees of freedom for the spatial configuration of the at least three elements in the non-flat device, thereby obtaining a layout of a flat device; and (ii) fabricating the flat device in accordance with the obtained layout of the flat device, wherein fabricating the flat device comprises forming mechanical interconnections by providing a patterned layer of a non-stretchable flexible material, the layer being patterned in accordance with the layout of the flat device,
thereby obtaining the flat device.

2. The method according to claim 1, wherein fabricating the flat device further comprises forming for at least one pair of elements of the at least two pairs of elements, an electrical connection between the first element and the second element of the pair, wherein forming the electrical connection comprises providing a patterned layer of an electrically conductive material between the first element and the second element of that pair.

3. The method according to claim 2, wherein forming the electrical connection between the first element and the second element comprises providing the patterned layer of the electrically conductive material on the patterned layer of the non-stretchable flexible material of a corresponding mechanical interconnection between the first element and the second element.

4. The method according to claim 1, wherein the method further comprises at least partially embedding the flat device in a thermo-formable material.

5. The method according to claim 4, wherein fabricating the flat device comprises fabricating the flat device on a temporary flat carrier and wherein at least partially embedding the flat device in a thermo-formable material comprises removing the flat device from the temporary flat carrier and providing a first thermo-formable layer or layer stack and a second thermo-formable layer or layer stack at least partially embedding the flat device.

6. The method according to claim 4, wherein fabricating the flat device comprises fabricating the flat device on a first thermo-formable layer or layer stack and wherein at least partially embedding the flat device in a thermo-formable material further comprises providing a second thermo-formable layer or layer stack overlaying the flat device.

7. The method according to claim 1 further comprising:
deforming the flat device into the non-flat device by a thermoforming process using a mold having a shape corresponding to the shape of the non-flat device, thereby stretching the stretchable mechanical interconnections and positioning the at least three elements at their predetermined location.

8. The method according to claim 7, wherein at least one mechanical interconnection has a centerline with a total length larger than the corresponding calculated distance and wherein deforming the flat device into the non-flat device partially stretches the at least one mechanical interconnection, thereby partially straightening its centerline and forming a wavy mechanical interconnection.

9. The method according to claim 7, wherein the method further comprises, after deforming the flat device into the non-flat device, removing a part of the border area of the layout of the flat device.

10. The method according to claim 7, wherein the component elements comprise electronic components, optoelectronic components, mechanical components, optical components, photonic components or sensors.

* * * * *